United States Patent

Crary

[15] 3,661,576

[45] May 9, 1972

[54] PHOTOPOLYMERIZABLE COMPOSITIONS AND ARTICLES

[72] Inventor: Edward N. Crary, Pewaukee, Wis.

[73] Assignee: W. H. Brady Co., Milwaukee, Wis.

[22] Filed: Feb. 9, 1970

[21] Appl. No.: 9,857

[52] U.S. Cl. ............................96/35.1, 96/115 P, 96/115 R, 96/87 R, 96/86 P

[51] Int. Cl. ............................................................G03c 1/68

[58] Field of Search ..................96/115, 115 P, 35.1, 87, 86 P

[56] References Cited

UNITED STATES PATENTS

| | | | |
|---|---|---|---|
| 3,427,161 | 2/1969 | Laridon et al. | 96/35.1 |
| 3,469,982 | 9/1969 | Celeste | 96/35.1 |
| 3,060,026 | 10/1962 | Heiart | 96/115 X |

FOREIGN PATENTS OR APPLICATIONS

| | | | |
|---|---|---|---|
| 794,572 | 5/1958 | Great Britain | 96/115 |

*Primary Examiner*—Ronald H. Smith
*Attorney*—Donald G. Casser, Adrian L. Bateman, Jr. and Wm. W. Rymer

[57] ABSTRACT

Photopolymerizable articles and compositions incorporating ethylenically unsaturated polyhydroxy diester polyethers as the active photopolymerizable ingredient, more specifically, acrylic and methacrylic diesters of diepoxy polyethers derived from aromatic polyhydroxy compounds. The articles and compositions are useful for dry photoresist films, for the manufacture of etched printing plates, as resist materials for chemical milling, and other uses which may utilize a photoactive layer or stratum.

14 Claims, 2 Drawing Figures

INVENTOR
EDWARD N. CRARY

PHOTOPOLYMERIZABLE COMPOSITIONS AND ARTICLES

BACKGROUND OF THE INVENTION

1. Field

This invention relates to the field of photopolymerizable compositions; more particularly, it relates to compositions containing compounds which are capable of addition polymerization when subjected to actinic radiation for the production of various types of photopolymerizable articles.

2. Prior Art

Photoresist coatings represent one of the principal uses of photosensitive compounds and the ensuing discussion of the back-ground of this invention will be made with reference to photoresist coatings as employed in the manufacture of etched and plated articles such as printed electronic circuits.

The usual photoresist materials have been liquid coatings incorporating the active ingredients, but the liquid resist coatings have been found to possess a number of disadvantages which raise serious problems for those who use them. Special equipment and substantial time are required to prepare the photoresist solutions, which operations are carried out by the end user just prior to the time of application of the coatings. The various methods for applying liquid photoresist coatings, dipping, spraying and roller coating, make it difficult to obtain a coating of uniform thickness, cause problems of filling in apertures when coated onto perforated circuit boards, and are rather slow manufacturing techniques. The dried coatings often have pin-holes, and they must be protected from dirt or other contamination. The formation of thick coatings is difficult with liquid photoresists and require consuming multiple operations so that thin resist coatings on the order of 0.1 to 0.2 mils thick are a typical result. Thin coatings are a disadvantage when the resist is to be subjected to prolonged electroplating, and the profile of the plated circuit is affected by the coating thickness. Drying of the coatings necessitates a combination of air and oven drying steps which take a good deal of time and need special equipment. Another important disadvantage is that considerable hand labor is required throughout a liquid photoresist operation, both for touchup purposes and because the usual processing steps do not lend themselves to a continuous or automated operation.

The above problems, and others, have been so widely known that it was inevitable that other types of photoresist coatings would become available and so-called "dry photoresist" materials are now available. Dry photoresists employ a photo-sensitive coating that is a solid layer and is supplied to the end user in a finished or pre-formed condition. The dry photoresists employ photopolymerizable compounds mixed with organic binders to form the desired film and provide a dry stratum which can be transferred to the object that is to be processed with a photoresist coating. The dry photoresist films are sold as a sandwich construction in which the photo-sensitive layer is contained between two webs of thin flexible film, one being the support film on which the photoresist coating is deposited during its manufacture and the other a cover film applied over the dried photoresist coating to protect it until final use. The support film is often a polyethylene terephthalate film because it can withstand the drying temperatures used in depositing the photoresist coatings and polyethylene is often used as the cover film. When using a dry photoresist film of this type, the operator strips away the cover film and laminates the photoresist layer to the article which is to be processed, the article is exposed to the desired negative under a proper light source while the support film remains attached to the photoresist layer; after exposure, the support film is stripped away while the photoresist layer remains adhered to the article and is developed to remove those portions of the coating which were not polymerized under the exposure conditions.

Dry photoresist film of the above construction eliminates a sub-stantial number of the problems of liquid photoresist coatings in that the end user does not have to prepare solutions, dry lamination used to apply the resist to an object eliminates the various liquid coating application methods and their attendant disadvantages, the dry films can bridge perforated portions of a circuit board, and the use of dry photoresist films lend itself much more readily to continuous or automated type of operations than the liquid photoresist coatings.

The dry photoresist films commercially available at the present time, however, also present problems of their own, some of which will be discussed briefly. First, after meticulous cleaning, the substrate article to which the film is to be laminated must be immersed in an adhesion-promoting solution, generally acidic, for several minutes (e.g. 2 to 4 minutes) and then dried to form an acidified surface to insure satisfactory adhesion of the photoresist film. Secondly, the commercial films presently employ a liquid photo-active compound that is admixed with an organic binder to form the dry photoresist layer; under the temperature conditions at which the film is laminated to an object, it has been found that these liquid materials volatilize and can give off toxic or obnoxious vapors that complicate their handling and use in a commercial operation. The adhesion of the known dry photoresist films is not particularly outstanding and they do not adhere well to many types of metals which a manufacturer may desire to process through the use of a photoresist coating. In addition, a holding delay of about one-half hour is mandatory after the dry films are laminated to a substrate article and before further processing can take place in order to allow the film to equilibrate or normalize on the substrate to which it has been joined, and this time delay complicates the establishment of a fully continuous process using the films. Once the dry film has been laminated to the article, a post-bake is required at elevated temperatures on the order of about275°-325° F. for time periods of up to one-half hour in order to secure acceptable adhesion of the film. This post-bake requirement further inhibits completely continuous processing. The presently-commercial dry photoresist films also exhibit a tendency to delaminate from the article in the presence of a copper pyrophosphate plating bath. Further, another disadvantage arises from the fact that it can be difficult to remove the exposed or polymerized resist after the article has gone through baking, plating and/or etching stages. These problems are substantial enough to preclude a fully satisfactory utilization of dry photoresist films in the form in which they are presently available.

SUMMARY OF THE PRESENT INVENTION

My present invention is based upon the unexpected discovery of a new class of resinous compounds which are useful as the photopolymerizable ingredient for the manufacture of photopolymerizable compositions and supported light-sensitive articles such as dry photoresist films, printing plate constructions, etc. The particular active ingredients are ethylenically unsaturated polyhydroxy diester polyethers, more specifically acrylic and methacrylic diesters of diepoxy compounds derived from aromatic polyhydroxy compounds such as bisphenols, novolaks and similar compounds. The defined diester polyethers have an aromatic chain structure with terminal ethylenic linkages at each end and differ from the compounds employed by the prior art for similar photosensitive products. Plambeck U.S. Pat. No.2,760,863 is an early disclosure of a general class of acrylic and methacrylic compounds as photopolymerizable materials and several more recent U.S. Pat. Nos., see e.g. 3,043,805, 3,261,686, 3,380,831 and 3,469,982, cover various types of specific acrylic and methacrylic compounds. The diester polyether compounds employed in my invention are not disclosed in these patents and it has been found that the novel photopolymerizable compositions of this invention yield new results that are extremely useful in this art.

Some of the main objects of this invention are: to provide a new class of photopolymerizable compositions for articles utilizing a photo-active layer; to provide dry photoresist materials that have improved adhesion and are easier to process than the dry photoresist films now available; to provide photopolymerizable articles such as dry photoresist films having involatile photo-active ingredients and thereby eliminate problems caused by the evolution of toxic or irritating vapors when the films are subjected to elevated temperatures; to provide photopolymerizable layers which can be laminated to a variety of substrates, and in which cleaning of the substrate prior to such lamination is not as critical as it is with present dry photoresist materials; and to eliminate process time delays required by presently-available materials after lamination to the substrate article to be processed. Another main object is to achieve these new results while still providing a photopolymerizable material that gives excellent optical resolution. A more particular object is to provide the specific compositions and other features hereinafter claimed.

The ensuing description sets forth this invention in detail by reference to a number of specific examples, compounds and compositions; these are meant to be illustrative, not limiting, inasmuch as it is anticipated that those skilled in the art may be able to devise changes from the disclosed embodiments that will remain within the true spirit and scope of this invention.

DESCRIPTION OF THE DRAWINGS

The description makes reference to the accompanying drawings, in which.

DESCRIPTION OF PREFERRED EMBODIMENTS

The photopolymerizable compounds to be used in the articles and compositions of this invention were described above as acrylic and methacrylic diesters of diepoxy polyethers derived from aromatic polyhydroxy compounds such as bisphenols, novolaks and similar compounds. The diester polyethers within this definition derived from a bisphenol have the following type formula when bisphenol-A is used:

FORMULA A

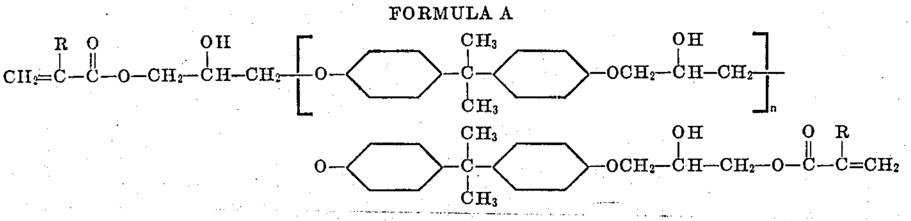

in which R is H- or $CH_3$-, and *n* is 0 to 2.0. Diesters of this composition are available commercially, as indicated in the examples below, so their preparation will not be described in detail. Briefly, however, they may be prepared by charging a reaction vessel with 2 moles of acrylic or methacrylic acid, 1 mole of the diepoxy compound, a suitable catalyst (usually a tertiary amine, preferably triethylamine) and a vinyl polymerization inhibitor (generally a hydroquinone or quinone). An inert solvent may be employed if desired. The mixture can be heated in two stages to complete the reaction, the first between room temperature and about 100° C. for about ½ to about 5 hours until there is a substantial decrease in the carboxylic acid groups and the second stage at a higher temperature between about 80°–200° C to complete the reaction. Other preparation methods can be followed. The diester polyethers within the foregoing definition derived from a novolak polyhydroxy compound, which are also available commercially and can be prepared in a similar manner, have the following type formula:

FORMULA B

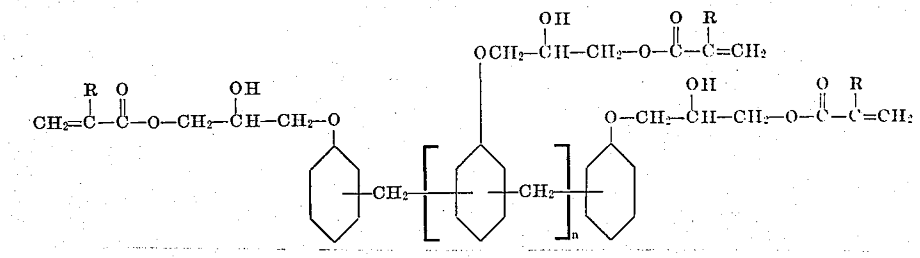

in which R is H- or $CH_3$-, and *n* is 0 to 1.3. The specified diesters are further characterized as being high viscosity resinous liquids having an aromatic chain structure with terminal ethylenic linkages at each end.

Photopolymerizable compositions using the diester polyethers can be utilized in several different forms. The diester polyether can be mixed in a suitable solvent (e.g. toluol, methyl ethyl ketone, acetone, etc.) together with an addition polymerization initiator activatable by actinic radiation, hereinafter referred to as the catalyst. Useful catalysts include substituted and unsubstituted polynuclear quinones or difunctional ketones, for example benzophenone, 2-methylanthraquinone and 4-chloro benzophenone. A dye may also be added to the composition. A photopolymerizable composition of these ingredients can be applied to an object and dried to a tacky coating; if it is not to be used immediately, the coating should be protected by a film or coating layer.

Figure 1:
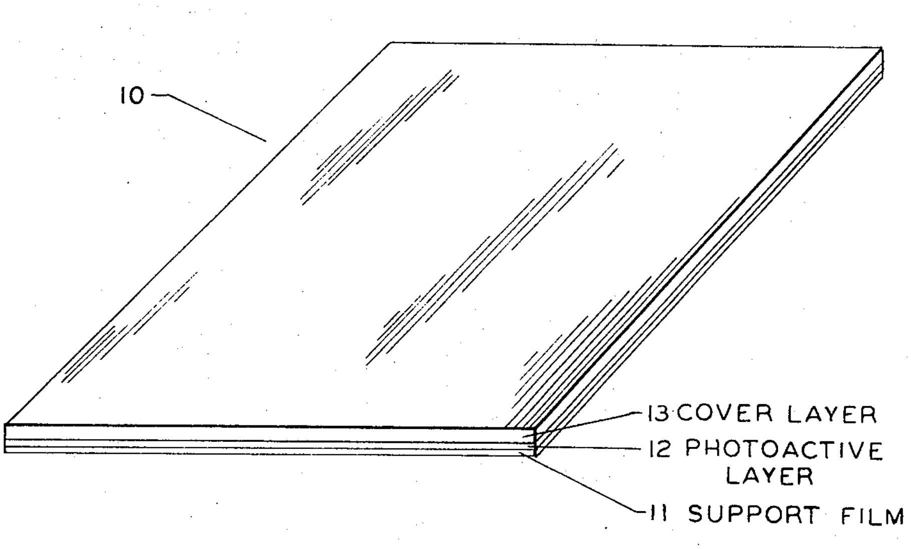
FIG. 1 is a perspective view of one type of photopolymerizable article according to the present invention.
Figure 2:
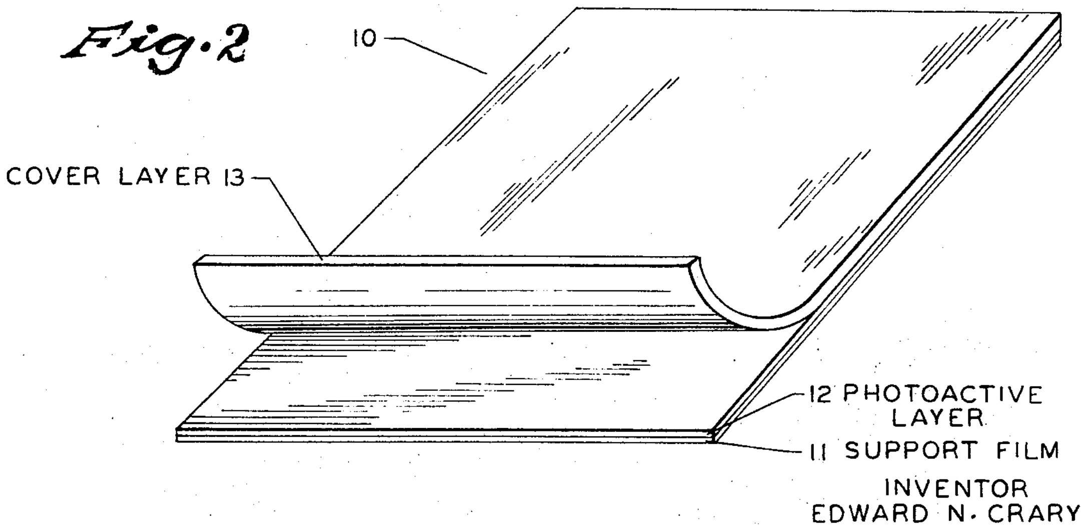
FIG. 2 shows the photopolymerizable article of FIG. 1 with the cover layer in the process of being removed.

Another form is to mix the diester polyether together with an organic film-former and a catalyst, with or without a dye, in a solvent and apply the coating onto a support film; again, the dried photoactive layer should be protected with a film or coating layer if it is not to be exposed immediately. The composition will form a dry photoactive layer suitable for use as a dry photoresist film, etc. An article of this type is illustrated in FIGS. 1 and 2 which show a photopolymerizable article 10 comprising a support film 11, a photopolymerizable layer 12 and a cover layer 13. In the manufacture of an article 10, the photoactive layer 12 is coated onto the support film 11 and dried, after which the cover layer is applied over the coating to form a three-layer sandwich construction. The photoactive layer is compounded as described in Examples 1–4 below and forms a dry photoresist coating. The support film 11 is of a suitable material that will be resistant to the solvent used for the coating employed as the photoactive layer 12, thermally stable at the temperature conditions under which the coating is dried (usually at temperatures of 150° to 275°), and dimensionally stable. In addition, the support film 11 is to be transparent to actinic radiation of the wave length which will cause the photoactive layer 12 to photopolymerize. Various types of film materials can be used for the support layer, but a transparent polyethylene terephthalate film of 1 to 10 mils thick has proved especially satisfactory because it has the requisite thermal and solvent resistance properties and dimensional stability. The cover layer 13 can be any suitable material which will release cleanly from the photoactive layer 12 and it may comprise a thin sheet of film such as polyethylene or a release coated paper or plastic film. The cover layer 13 is intended to protect the photoactive layer 12 while the photopolymerizable element is being stored prior to use. The cover layer should be removable from the photoactive layer without delamination of the photoactive layer from the support film. When the photopolymerizable article 10 is used as a dry photoresist film, the cover layer 13 is stripped away to expose the photoactive layer 12 as illustrated in FIG. 2, and the photoactive layer 12 is then laminated or joined, using heat and/or pressure as necessary, to an object such as copper clad phenolic circuit board material used for printed circuits. The support layer 11 may remain affixed to the photoresist layer until after the latter is exposed to actinic radiation through a suitable negative or transparency to provide polymerized sections in selected areas in order to form the desired resist configuration, such as a printed circuit; hence the support layer 11 must be transparent to actinic radiation in order to permit polymerization of the photoactive layer through it, unless the support layer is removed from the photoactive layer prior to exposure. Also, the support layer prevents the negative from adhering to unexposed portions of the photoactive layer and protects against oxygen inhibition of polymerization of the photoactive layer and protects during exposure. If desired, a transparent aqueous or solvent removable layer can be interposed between the photoactive layer and the support film so that the support film can be removed prior to exposure. The unpolymerized or unexposed portions of the photoactive layer 12 are removed with a suitable solvent after removal of the support layer to leave behind hard polymerized resist sections of the photoactive layer in the desired pattern on the object, which is then ready for etching or plating treatments in the typical manner. It has been found that when the photoactive layer 12 utilizes the new compositions of this invention, a number of important properties are significantly improved in comparison to the dry photoresist films of the prior art.

The following examples further illustrate the present invention. The term "parts" as used hereinafter refers to parts by weight unless otherwise designated.

EXAMPLE 1

The following composition was prepared:

| | |
|---|---|
| (1) Ethylenically unsaturated diester | |
| methyacrylic acid diester of bisphenol-A/epichlorohydrin diepoxy ("Epocryl" 12–A–85), $m$=0 in Formula A | 412.0 parts |
| acetone solvent | 72.6 parts |
| (2) Organic film-former | |
| methyl methacrylate/methyl acrylate copolymer (Acryloid A101) | 106.0 parts |
| methyl ethyl ketone solvent | 159.5 parts |
| (3) Catalyst | |
| 2-methylanthraquinone | 10.6 parts |
| (4) Dye | |
| Rhodamine "B" Base Dye | 0.3 parts |
| (5) Solvent | |
| toluene | 239.0 parts |
| | 1000.0 parts |

The above composition was prepared by adding, in order, the diester (as 85 percent solids in the acetone), the film-former (as 40 percent solids in MEK), the dye and the catalyst to the toluene solvent and mixing the combined ingredients by an air driven mixing blade until the catalyst was in solution. The resulting composition was coated onto a 12 inch wide web of 1 mil thick clear polyethylene terephthalate film (Mylar) and oven dried at about 200° F. The dried coating was 1 mil thick and in the form of a dry, slightly tacky stratum. Next, a 4 mil thick sheet of white polyethylene film was laminated to the dried coating, to thereby form a three-layer photopolymerizable article of the construction shown in FIG. 1 in which the 1 mil polyethylene terephthalate is the support layer 11, the coating of example 1 is the photopolymerizable layer 12 and the 4 mil polyethylene is the cover layer 13.

EXAMPLE 2

The following photopolymerizable composition was prepared:

| | |
|---|---|
| (1) Ethylenically unsaturated diester | |
| acrylic acid diester of bisphenol-A/epichlorohydrin diepoxy, (Nupol 46–4006), $n$=0 in Formula A | 361.3 parts |
| (2) Organic film-former | |
| methyl methacrylate/methyl acrylate copolymer (Acryloid A101) | 189.0 parts |
| methyl ethyl ketone solvent | 282.8 parts |
| (3) Catalyst | |
| 2-methylanthraquinone | 5.9 parts |
| (4) Dye | |
| Rhodamine "B" Base Dye | 0.3 parts |
| (5) Solvent | |
| toluene | 160.7 parts |
| | 1000.0 parts |

The above coating was prepared and applied as described in example 1 to form a three-layer photopolymerizable article in which the coating of example 2 was the photopolymerizable layer 12.

EXAMPLE 3

The following composition was prepared:

| | |
|---|---|
| (1) Ethylenically unsaturated diester | |
| acrylic acid diester of novolak diepoxy (Nupol 46–4424), $n$=1.3 in Formula B | 310.5 parts |
| toluol solvent | 34.5 parts |
| (2) Organic film-former | |
| copolymer of Example 1 | 174.4 parts |
| methyl ethyl ketone solvent | 261.6 parts |
| (3) Catalyst | |
| 4-chloro benzophenone | 49.0 parts |
| (4) Dye | |
| Rhodamine "B" Base Dye | 0.5 parts |
| (5) Solvent | |
| toluene | 62.2 parts |
| methyl ethyl ketone | 107.3 parts |
| | 1000.0 parts |

The coating of example 3 was prepared and applied as described in example 1 to form the photopolymerizable layer 12 of the three-layer photopolymerizable article.

The adhesion of the three-layer dry photoresist films of examples 1, 2 and 3 were measured according to the following procedure and compared to the adhesion of a commercially-available dry photoresist film (sold under the trademark "Riston" by E. I. duPont de Nemours and Company) hereinafter referred to as the prior art film. The photo-active layer of each resist film was heat laminated at 175°F. to a 0.060 inch cast acrylic sheet, the acrylic sheet being first preheated for 10 minutes at 175° F. After cooling to room temperature, the support film was removed and the photoactive layer was heat laminated at 250° F. to 1 inch × 4 inch strips of copper clad phenolic board of the type used for printed circuits which had been cleaned by swabbing the metal surface with MEK and then scouring with "Scrub Clean" cleanser, rinsed and dried. The samples were cut and trimmed to provide 1 inch square overlap specimens and cured for 2 to 3 minutes under an ultraviolet lamp. Tensile shear was determined on a Thwing Albert machine at a cross-head speed of 12 inches per minute. The following results were obtained:

| Film | Tensile Strength Range | Average |
|---|---|---|
| Example 1 | 17–45 psi | 32.4 psi |
| Example 2 | 100+psi | 100+psi |
| Example 3 | 100+psi | 100+psi |
| Prior Art Film | 0–12 psi | 3 psi |

It was also found that the films of examples 1, 2 and 3 had excellent adhesion to 302 stainless steel and Kovar sheets.

Next, the films of examples 1, 2 and 3 and the prior art film were tested for the presence of volatile matter by pyrolyzing the photoactive layers on a hot plate and collecting the volatile matter on a cool microscope slide. The residue was flushed off with MEK, concentrated and examined by IR analysis. It was found that no volatile matter was isolated from the films of examples 1, 2 and 3. The residue from the prior art film appeared to be low molecular weight poly (trimethylolpropane triacrylate), which compound is known to be irritating to skin and eyes and can cause blistering or sensitization. Thus, in comparison, the films of examples 1–3 contain no toxic or irritating volatile matter.

The films of examples 1, 2 and 3 and the prior art film were used to manufacture printed circuits according to the following process and several important differences were discovered as noted below.

Step I. Using a commercial dry film laminating machine, the cover layer of each film was removed and the support layer drawn over a heated roll to soften the photoactive layer which was then immediately laminated to a 9 inch × 12 inch sheet of clean copper clad phenolic board, using a laminating speed of 6 feet per minute at a temperature of 240° F.

1. It was found that after the above lamination of the films of examples 1, 2 and 3 to the copper clad board, there was no need to wait for any length of time before the laminated composite structure underwent the further processing steps listed below. However, it was necessary to wait ½ hour before further processing of the prior art film could take place after lamination. This property of the films of this invention enables the resist user to eliminate a substantial time delay that inhibits a truly continuous operation.

2. During preparation of the copper clad board for processing in this manner, it was noted that the board had to be immersed in an adhesion-promoting solution before workable adhesion of the prior art film to the board was obtained, whereas such immersion step was not required with the films of examples 1, 2 and 3. Further testing showed that the films of examples 1, 2 and 3 could be successfully adhered to copper clad board having surface oxidation, but the prior art film could not be so adhered.

3. The lack of volatile matter described above with regard to the films of examples 1–3 becomes of importance at this stage of the process because the temperatures used for lamination can drive off irritating vapors with the prior art film but not with those of examples 1–3. Oftentimes, the time delays and high temperatures involved in laminating can cause this stage of the process to be complicated if irritating or toxic vapors are present.

Step II. After removal of the excess film around the edges of the copper clad boards, a suitable negative of a printed circuit was placed emulsion side down on top of the support layer of each film and each sample was then placed in a commercial exposure unit (Scanex 40K machine) equipped with a vacuum table to insure good negative contact and exposed to a high pressure mercury vapor lamp for 10 seconds. Following exposure, the negative was removed and the support film was peeled off to leave the 1 mil thick photoactive layer of each film adhered to the board samples. The photosensitive layers from each film that remained on the copper boards were hard and tack-free in the areas that had been exposed to the mercury vapor lamp and soft and slightly tacky in the unexposed areas. The samples were then sprayed with 1, 1, 1 trichloroethane to remove the soft unexposed coating and thereafter flushed with tap water to remove the residual solvent, these steps being performed in a commercial developing unit.

1. It was found that the unexposed areas of the resist coatings from the films of examples 1, 2 and 3 were removed after only 15 seconds of exposure to the solvent whereas the prior art film required 60 seconds for removal, a four-fold decrease in the "developing" time thus being obtainable with dry resist films according to this invention.

2. Before the board samples using the prior art film could be processed further, it was necessary to employ a "post-bake" at 300° F. for 15 minutes so that the hardened resist pattern on the boards would not become delaminated during the electroplating operation. The boards having resist patterns from the films of examples 1, 2 and 3 did not require any post-bake and, surprisingly, remained completely adherent to the boards during electroplating without post-bake. This feature of the films according to this invention thus allows the resist user to eliminate yet another delaying operation.

Step III. The copper clad boards with the selectively cured and developed resist coating on the copper surface were placed in an etching machine (Dea Jet Spray Etcher, 3000 series) and sprayed with 42° baume ferric chloride heated to 120°F. for 2 minutes to produce an etched circuit. Alternatively, some of the boards with the developed resist coating were plated to deposit a 0.8 mil copper layer in the uncoated areas, a 0.2 mil tin-lead layer was electroplated over the copper areas, the developed resist was removed and the exposed copper was then etched away using the foregoing etching procedure.

1. It was noted that the board samples having a resist coating from the films of examples 1, 2 and 3 showed no delamination or break-down of the resist coatings whereas some boards using the prior art film showed delamination and break-down of the coating, particularly along the edges of the image where the plating action is most severe.

2. It was further discovered that removal of the resist after etching or plating was significantly easier with the boards having the resists according to this invention. Specifically, the developed resist areas of the boards made with the films of examples 1, 2 and 3 were removed upon only 15 seconds exposure to a methylene chloride stripper without any mechanical agitation whereas boards with the prior art resist needed 1 minute exposure to the solvent combined with brushing or other mechanical agitation in order to be completely removed.

The foregoing comparative tests demonstrate that dry photoresist films utilizing photopolymerizable compositions according to the present invention exhibit a number of novel characteristics that have substantial utility in the photoresist art.

The next example sets forth another composition of this invention which can be utilized to make three-layer photoresist films as described in examples 1–3.

EXAMPLE 4

The following composition was prepared:

| | |
|---|---|
| (1) Ethylenically unsaturated diester | |
| diester of Example 3 | 398.0 parts |
| toluol solvent | 44.0 parts |
| (2) Organic film-former | |
| cellulose acetate | 294.0 parts |
| (3) Catalyst | |
| benzophenone | 44.0 parts |
| (4) Solvent | |
| acetone | 220.0 parts |
| | 1000.0 parts |

The next three examples illustrate photopolymerizable compositions which do not use an organic film-former.

EXAMPLE 5

The following composition was prepared:

| | |
|---|---|
| (1) Ethylenically unsaturated diester | |
| methacrylic acid diester of bisphenol-A/epichlorohydrin diepoxy, $n=0$ in Formula A | 35.9 parts |
| (2) Catalyst | |
| 2-methylanthraquinone | 0.8 parts |
| (3) Solvent | |
| toluene | 15.0 parts |
| | 51.7 parts |

EXAMPLE 6

The following composition was prepared:

| | |
|---|---|
| (1) Ethylenically unsaturated diester acrylic acid diester of bisphenol-A/epichlorohydrin diepoxy, $n$=0 in Formula A | 31.0 parts |
| (2) Catalyst 2-methylanthraquinone | 0.8 parts |
| (3) Solvent toluene | 20.0 parts |
| | 51.8 parts |

EXAMPLE 7

The following composition was prepared:

| | |
|---|---|
| (1) Ethylenically unsaturated diester acrylic acid diester of novolak diepoxy, $n$=1.3 in Formula B | 30.0 parts |
| (2) Catalyst benzophenone | 1.6 parts |
| (3) Solvent toluene | 20.0 parts |
| | 51.6 parts |

The compositions of examples 5, 6 and 7 were coated onto a support film comprising a 1 mil thick transparent polyethylene terephthalate film and dried to a tacky photoactive coating. The coatings showed excellent adhesion to metal substrates, e.g. copper clad phenolic boards, stainless steel, etc., when heat laminated thereto in the manner described in Example 1. The coatings were exposed to a high pressure mercury vapor lamp as described previously, after which the support film was stripped away and the unexposed portions of the coatings were removed with solvent to yield a hardened, polymerized resist pattern on the metal substrates. It was found the coatings adhered well to the substrates and exhibited excellent optical resolution, with the coating of example 5 having better resolution than those of examples 6 and 7. The compositions of examples 5, 6 and 7 are not as convenient to work with as those of examples 1–4 because they are more tacky, but they are useful photopolymerizable compositions that can be used in photoresist applications.

As described hereinabove, the photopolymerizable compositions of this invention are to include two essential ingredients, (1) a photoactive ingredient selected from a specified class of unsaturated diester polyethers, and (2) an addition polymerization initiator activatable by actinic radiation. Other ingredients which can be added to obtain particular features are (3) an organic film-former, and/or (4) a dye. The ingredients are to be admixed in a suitable solvent, the particular quantity of solvent being dependent upon the type of coating procedure and equipment which will be used to form the compositions into a photoactive layer, coating or stratum on a substrate film or article.

The first essential ingredient, the photoactive compound (1) is to consist of an acrylic or methacrylic diester of a diepoxy polyether derived from a bisphenol, novolah or biphenol polyhydroxy compound. The polyhydroxy component of the diester polyethers according to Formula A will normally be bisphenol-A as set forth in the preceding examples, but may also comprise other bisphenols, including: methylene-bisphenols; ethylene-bisphenols; propylene-bisphenols; p, p'-biphenols; and butylene-bisphenols. The generic type formula for these compounds, (which includes compounds according to Formula A previously set forth) is as follows:

FORMULA I

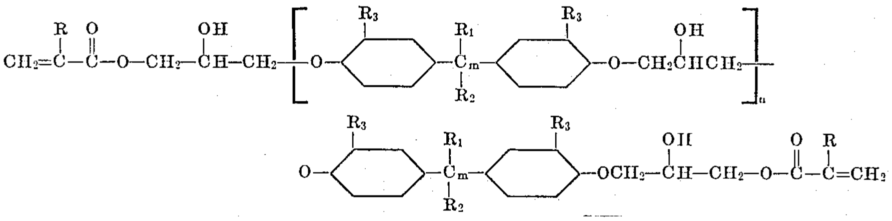

in which R is H or $CH_3$, $n$ is 0 to 2.0, $m$ is 0 or 1, $R_1$ is H or $CH_3$ when $m$ is 1 and $R_2$ is an H, $CH_3$ or $C_2H_5$ group when $m$ is 1.$R_3$ is hydrogen or an alkyl group of one to four carbon atoms. Compounds according to Formula I are high viscosity resinous materials. When a novalak, i.e. a thermoplastic resin made from reacting a phenol with an aldehyde such as phenol reacted with formaldehyde, is used as the aromatic polyhydroxy compound, the resulting diester polyethers are high viscosity resinous materials of the structure of Formula B set forth above. The term "diester" polyether as used herein with reference to compounds according to Formula B is meant to include triesters and quadesters when n is greater than zero in Formula B. Diester polyethers of the specified compositions are capable of addition polymerization through the terminal ethylenic linkages at each end of the molecules when subjected to actinic radiation in the ultraviolet portion of the light spectrum, generally in the range of 2,200 to 4,400 Angstroms, preferably about 3,500 to 3,700 Angstroms. Suitable sources include high pressure mercury vapor lamps, carbon arc lamps, xenon pulsed lamps and black-light fluorescent lights (hot filament). Photopolymerizable compositions incorporating the specified diester polyethers are negative working, and the photographic negative through which a pattern is to be developed in the coatings should have clear areas defining those portions which are to be polymerized and hardened to a resist coating upon exposure to the actinic radiation.

The addition polymerization initiator component (2), or catalyst forming the second essential ingredient of photopolymerizable compositions of the present invention can be any compound that will generate free radicals upon exposure to the actinic radiation and thereby cause polymerization of the diester polyether component through the terminal ethylenically unsaturated groups at each end of the polyether molecules. The catalyst should be thermally inactive at the elevated temperatures to which the photopolymerizable compositions may be subjected during drying and heat lamination as described above; generally thermal stability in the range of about 325°–425° F. being satisfactory. The amount of catalyst present in the composition depends upon the quantity of the unsaturated diester component (1) and will also vary in accordance with the particular catalyst employed. Generally, very small amounts of the catalyst are required, on the order of about 1 to 20 percent of the amount of the diester polyether component being operative. A wide variety of compounds are suitable as addition polymerization initiators for the defined class of unsaturated diester polyethers, including the substituted or unsubstituted polynuclear quinones which are compounds having two intracyclic carbonyl groups attached to intracyclic carbon atoms in a conjugated six-membered carbocyclic ring, there being at least one aromatic carbocyclic ring fused to the ring containing the carbonyl groups. Such initiators include 9, 10-anthraquinone, 1-chloroanthraquinone, 2-chloroanthraquinone, 2-methylanthraquinone, 2-tert-butylanthraquinone, octamethylanthraquinone, 1, 4-naphthoquinone, 9, 10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenzenze[a]anthracene-7,12-dione. Other initiators which are useful include vicinal ketaldonyl compounds, such as diacetyl, benzil, etc; alpha-ketaldonyl alcohols, such as benzoin, pivalon, etc,; acyloin ethers, e.g., benzoin methyl and ethyl ethers, etc.; alpha-hydrocarbon substituted aromatic acyloins, such as alpha-methylbenzoin. Another important class of useful initiators are difunctional ketones such as benzophenone and substituted benzophenones including 4-chlorobenzophenone, 3,4-,2,4-,2,5- and 4,'-dimethylbenzophenones, and 4-methylbenzophenone.

The organic film-former component (3) when employed in a photopolymerizable composition of this invention is added so that the compositions will form a discrete or integral film-like layer, the unsaturated diester polyether component (1) not being a film-forming compound by itself. The film-former should be compatible with the diester polyether so that the photopolymerizable composition will not form a hazy layer, thereby maintaining its transparency to the actinic radiation which is to be used for addition polymerization of the diester polyether. Also, the film-former should not deleteriously affect the stability of the polyether photoactive ingredient, i.e. it should not cause gelling of the diester polyether or react with any of the reactive groups or sites of the polyether therein in any way which would interfere with polymerization through the terminal ethylenically unsaturated groups at each end of the polyethers. There is a wide variety of organic film-formers, principally thermoplastic materials that are solid at room temperature (70° F.) that are compatible with the specified diester polyethers so as to be capable of forming an ultraviolet-transparent composition when combined therewith and which are substantially non-reactive with the polyethers so as to impair their photopolymerization, including the following compounds: cellulose esters such as cellulose acetate, cellulose acetate succinate and cellulose acetate butyrate; polyvinyl chloride homopolymers and copolymers; cellulose ethers such as methyl cellulose, ethyl cellulose and benzyl cellulose; polyethylene oxides of polyglycols with molecular weights over 4,000; polyvinyl acetals such as polyvinyl butyral; polyformaldehydes; polystyrenes; copolyesters of a polymethylene glycol of 2 to 10 carbon atoms and acids such as sebacic, terephthalic, isophthalic and hexahydroterephthalic acids; and polyacrylates and alpha-alkyl polyacrylate esters, such as polymethyl methacrylate, polyethyl methacrylate and methyl methacrylate-methyl acrylate copolymers, the latter compound having been found an especially useful film-former.

The dyes which may be added to the photopolymerizable composition as an optional ingredient are used to obtain color contrast with the particular substrate, such as copper or other metal, to which the photoactive composition is applied so that the user can see the resist image after development. Any dye or pigment which will not inhibit or absorb ultraviolet actinic radiation of the wave length capable of causing polymerization of the photoactive diester polyether ingredient is suitable. The dye is preferably also selected to have good aging properties. Suitable dyes include: Crystal Violet; Calcocid Green S (C.I. 44090); Para Magenta (C.I. 42500); New Magenta (C.I. 42520); New Methylene Blue G.G. (C.I. 51195); Tartrazine (C.I. 19140); and Rhodamine (Magenta) "B" base dye.

The amount of each ingredient employed in the photopolymerizable compositions of this invention can vary within wide limits. When the compositions comprise only a diester polyether and catalyst, there can be about 80 to 99 percent polyether and about 1 to 20 percent polymerization initiator, as long as there is a sufficient quantity of catalyst to enable complete polymerization of the amount of diester polyether. In compositions including the diester polyether, catalyst and film-former, there can be about 40 to 85 percent diester polyether, about 15 to 60 percent organic film-former, and about 0.1 to 10 percent catalyst. A dye can be added to any of the foregoing compositions and very small amounts of about 0.1 to 1 percent are usually sufficient, the amount being controlled by the desired color. All of the foregoing percentages are on a weight basis. When the film-former is present in the compositions, the tackiness of the dried coatings decreases as the ratio of the film-former to the diester polyether increases, but there is a reduction in adhesion as the proportion of the film-former increases. Therefore, the quantity of film-former in any specific composition is selected to provide the balance desired between the tackiness and the adhesion of the coating. As stated previously, the amount of solvent employed with the compositions can be varied widely in accordance with the viscosity desired for the particular coating method by which the compositions are to be applied to substrates or films.

There has thus been described photopolymerizable compositions and articles prepared therefrom, together with methods of etching using such compositions and articles, which employ a specified class of unsaturated polyhydroxy diester polyethers as the photoactive ingredient, which diester polyethers are considered to be novel in the photochemical technical area to which this invention pertains. The use of the diester polyethers as taught by this invention leads to a number of highly useful new results and improved properties heretofore unobtainable with the compounds employed by the prior art for similar photopolymerizable compositions and which are believed to be unpredictable from the nature of the diester polyethers herein disclosed and from the photoactive ingredients of the prior art compositions. Although many advantages of the present invention have been described by reference to dry photoresist film articles made from the present photopolymerizable compositions, it is to be understood that the compositions may be employed in other uses and for other articles. Thus, photopolymerizable compositions of this invention can be used for chemical milling in which they are applied to substrates that are to be etched and they also may be used in the manufacture of printing plates in which the photopolymerizable composition is applied to a base sheet of plastic or metal, such as steel, aluminum, nylon, polyester, styrene and vinyl sheets. When used for printing plates, the photopolymerizable layer is processed by the methods described previously to develop a relief image in the layer that is then used as a printing plate. In whichever type of photopolymerizable article is made, the photopolymerizable compositions can be applied in a layer of almost any thickness, either very thin or very thick; for example, the thickness may range from about 0.1 mil to as thick as 20 mils, or even thicker if desired.

The photopolymerizable compositions of the present invention form optical images of extremely high or fine resolution under short exposure times ranging from as low as 5 or 10 seconds to about 5 minutes. In general, exposure times on the order of about 10 seconds to 2 minutes are suitable for most commercial uses of articles employing the composi-tions. Resolution tests performed with the films of examples 1, 2 and 3 upon exposure with a Colight Scanex 40K exposure unit using a Stouffer T-21 resolution negative demonstrated the films produced sharp and distinct resolution of the lines of the test negative. The films of Examples 2 and 3 had good resolution equivalent to that of the prior art film described above. However, the film of Example 1 using the methyl methacrylate diester polyether exhibited improved resolution in comparison to the prior art film and films of Examples 2 and 3, thereby giving it enhanced utility in many photoresist applications. An additional advantage of the photopolymerizable compositions of this invention which leads to improved photoresist films is that the shrinkage of the specified diester polyether compounds upon polymerization is on the order of only about 6 to 9 percent as compared to at least 14 percent shrinkage for films using trimethylolpropane triacrylate. The shrinkage is also reduced by the elimination of the post-bake that is possible with the compositions of this invention.

I claim:

1. A supported light-sensitive reproduction layer comprising:

1. a polyether of the formula

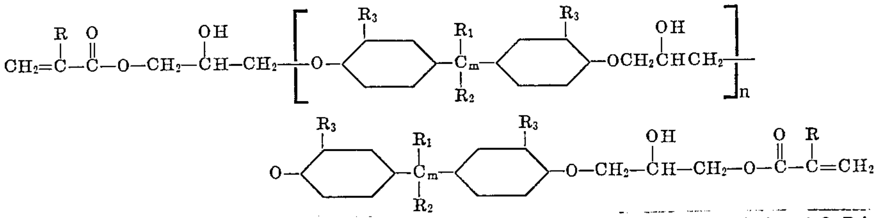

wherein R is hydrogen or a methyl group, $n$ is 0 to 2.0, m is 0 or 1, $R_1$ is hydrogen or a methyl group when m is 1, $R_2$ is hydrogen or a methyl or ethyl group when $m$ is 1, and $R_3$ is hydrogen or an alkyl radical of 1 to 4 carbon atoms; or 2. a polyether of the formula

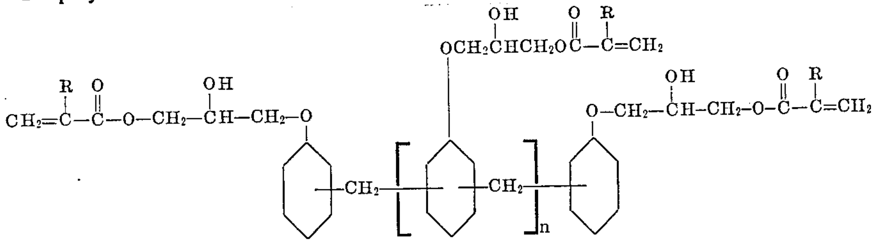

wherein $n$ is 0 to 1.3 and R is hydrogen or a methyl group; and 3. an addition polymerization initiator activatable by actinic radiation for causing polymerization of the polyether through terminal ethylenically unsaturated groups at each end of the polyether.

2. A method of etching that includes the steps of exposing and developing the layer of claim 1.

3. A photopolymerizable composition comprising:

1. an ethylenically unsaturated polyhydroxy polyether of the formula

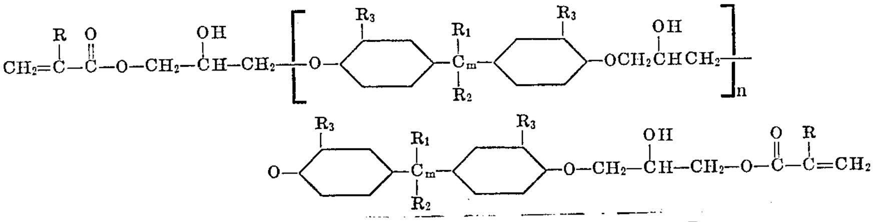

wherein R is hydrogen or a methyl group, $n$ is 0 to 2.0, $m$ is 0 or 1, $R_1$ is hydrogen or a methyl group when $m$ is 1, $R_2$ is hydrogen or a methyl or ethyl group when $m$ is 1, and $R_3$ is hydrogen or an alkyl radical of 1 to 4 carbon atoms; and 2. an addition polymerization initiator activatable by actinic radiation for causing polymerization of the polyether through terminal ethylenically unsaturated groups at each end of the polyether compound.

4. A photopolymerizable composition according to claim 3 wherein $n$=0 in the formula.

5. A photopolymerizable composition comprising:

1. an ethylenically unsaturated polyhydroxy polyether of the formula

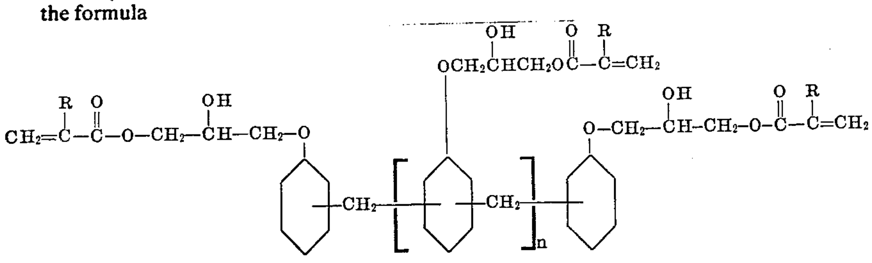

wherein $n$ is 0 to 1,3, R is hydrogen or a methyl group; and 2. an addition polymerization initiator activatable by actinic radiation for causing polymerization of the polyether through terminal ethylenically unsaturated groups at each end of the polyether compound.

6. A photopolymerizable composition according to claim 5 wherein $n$=1.3 in the formula.

7. A photopolymerizable composition comprising:

1. an ethylenically unsaturated polyhydroxy polyether compound (a) of the formula

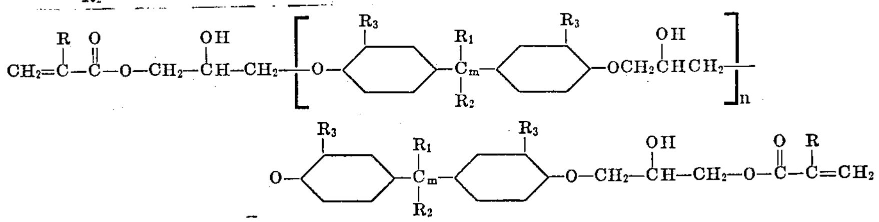

wherein R is hydrogen or a methyl group, $n$ is 0 to 2.0, $m$ is 0 or 1, $R_1$ is hydrogen or a methyl group when $m$ is 1, $R_2$ is hydrogen or a methyl or ethyl group when $m$ is 1, and $R_3$ is hydrogen or an alkyl radical of 1 to 4 carbon atoms; or (b) of the formula

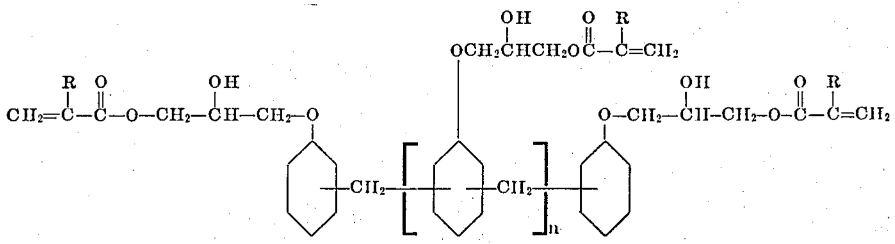

wherein $n$ is 0 to 1.3, and R is hydrogen or a methyl group;

2. an addition polymerization initiator activatable by actinic radiation for causing polymerization of the polyether through terminal ethylenically unsaturated groups at each end of the polyether compound; and
3. an organic thermoplastic film-former that is compatible with the polyether compound to form a clear dry film therewith.

8. A photopolymerizable composition according to claim 7, wherein:

the film-former is a cellulose ester; polyvinyl chloride homopolymer or copolymer; cellulose ether; polyethylene oxide of a polyglycol with a molecular weight over 4,000; polyvinyl acetal; polyformaldehyde; polystyrene; copolyester of a polymethylene glycol of 2 to 10 carbon atoms; polyacrylate; alpha-alkyl polyacrylate ester; or a methyl methacrylate-methyl acrylate copolymer.

9. A photopolymerizable article comprising, in combination:

1. a support layer;

(2). a dry photopolymerizable layer on one surface of the support layer consisting of a. an ethylenically unsaturated polyhydroxy polyether of the formula

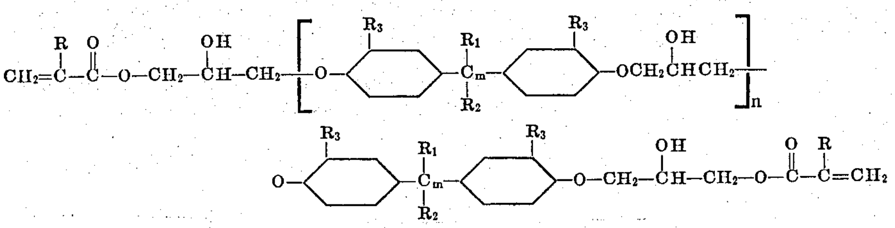

wherein R is hydrogen or a methyl group, $n$ is 0 to 2.0, $m$ is 0 or 1, $R_1$ is hydrogen or a methyl group when $m$ is 1, $R_2$ is hydrogen or a methyl or ethyl group when $m$ is 1, and $R_3$ is hydrogen or an alkyl radical of 1 to 4 carbon atoms; and b. an addition polymerization initiator activatable by actinic radiation for causing polymerization of the polyether through terminal ethylenically unsaturated groups at each end of the polyether compound, and c. an organic thermoplastic film-former that is compatible with the polyether compound to form a clear dry film therewith; and 3. a cover layer over the dry photopolymerizable layer that is removable therefrom without delamination of the photopolymerizable layer from the support layer.

10. A photopolymerizable article according to claim 9, wherein:

the film-former is a cellulose ester; polyvinyl chloride homopolymer or copolymer; cellulose ether; polyethylene oxide of a polyglycol with a molecular weight over 4,000; polyvinyl acetal; polyformaldehyde; polystyrene; copolyester of a polymethylene glycol of 2 to 10 carbon atoms; polyacrylate; alpha-alkyl polyacrylate ester; or a methyl methacrylate-methyl acrylate copolymer.

11. A photopolymerizable article comprising, in combination:

1. a support layer;
2. a dry photopolymerizable layer on one surface of the support layer consisting of a. an ethylenically unsaturated polyhydroxy polyether of the formula

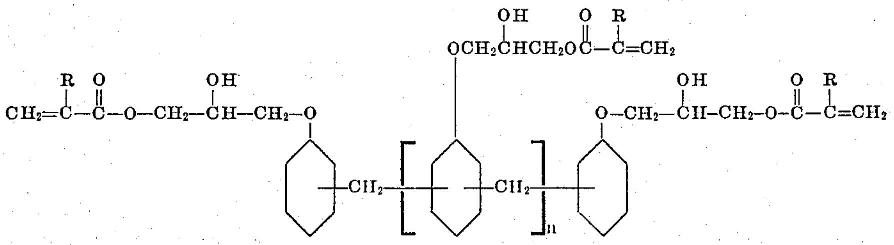

wherein $n$ is 0 to 1.3, and R is hydrogen or a methyl group;

b. an addition polymerization initiator activatable by actinic radiation for causing polymerization of the polyether through terminal ethylenically unsaturated groups at each end of the polyether compound, and c. an organic thermoplastic film-former that is compatible with the polyether compound to form a clear dry film therewith; and 3. a cover layer over the dry photopolymerizable layer that is removable therefrom without delamination of the photopolymerizable layer from the support layer.

12. A photopolymerizable article according to claim 11, wherein:

the film-former is a cellulose ester; polyvinyl chloride homopolymer or copolymer; cellulose ether; polyethylene oxide of a polyglycol with a molecular weight over 4,000; polyvinyl acetal; polyformaldehyde; polystyrene; copolyester of a polymethylene glycol of 2 to 10 carbon atoms; polyacrylate; alpha-alkyl polyacrylate ester; or a methyl methacrylate-methyl acrylate copolymer.

13. A photopolymerizable composition according to claim 3 wherein $n$=0, $m$=1, $R_1$ is a methyl group, $R_2$ is a methyl group, and $R_3$ is hydrogen.

14. A photopolymerizable article according to claim 9 wherein $n$=0, $m$=1, $R_1$ is a methyl group, $R_2$ is a methyl group, and $R_3$ is hydrogen.

* * * * *